(12) United States Patent
Lee

(10) Patent No.: US 10,659,047 B2
(45) Date of Patent: May 19, 2020

(54) OUTPUT DRIVING CIRCUIT

(71) Applicant: SK hynix Inc., Gyeonggi-do (KR)

(72) Inventor: Seung Ho Lee, Seoul (KR)

(73) Assignee: SK hynix Inc., Gyeonggi-do (KR)

(*) Notice: Subject to any disclaimer, the term of this patent is extended or adjusted under 35 U.S.C. 154(b) by 0 days.

(21) Appl. No.: 16/452,089

(22) Filed: Jun. 25, 2019

(65) Prior Publication Data

US 2019/0319623 A1 Oct. 17, 2019

Related U.S. Application Data

(63) Continuation of application No. 15/858,516, filed on Dec. 29, 2017, now Pat. No. 10,348,301.

(30) Foreign Application Priority Data

May 24, 2017 (KR) .......................... 10-2017-0063919

(51) Int. Cl.
| | |
|---|---|
| H03K 19/01 | (2006.01) |
| H03K 19/003 | (2006.01) |
| H03K 19/17788 | (2020.01) |
| H03K 19/017 | (2006.01) |
| H03K 19/00 | (2006.01) |

(52) U.S. Cl.
CPC ... *H03K 19/00315* (2013.01); *H03K 19/0005* (2013.01); *H03K 19/01742* (2013.01); *H03K 19/17788* (2013.01)

(58) Field of Classification Search
CPC ......... H03K 19/0005; H03K 19/00315; H03K 19/01742; H03K 19/17788
See application file for complete search history.

(56) References Cited

U.S. PATENT DOCUMENTS

| | | | | |
|---|---|---|---|---|
| 5,852,540 A * | 12/1998 | Haider | .................... | H02H 9/046 361/111 |
| 6,342,803 B1 * | 1/2002 | McManus | ........ | H03K 19/00315 327/108 |
| 6,693,469 B2 * | 2/2004 | Prodanov | ......... | H03K 19/00315 326/56 |
| 7,719,806 B1 * | 5/2010 | Boyd | .................... | H01L 27/027 361/56 |
| 8,610,488 B2 * | 12/2013 | Yu | ....................... | H01L 27/0266 327/112 |
| 8,817,434 B2 * | 8/2014 | Wang | .................. | H01L 27/0266 361/111 |
| 8,994,412 B2 * | 3/2015 | Kim | ................. | H03K 3/356165 327/109 |

(Continued)

*Primary Examiner* — Alexander H Taningco
*Assistant Examiner* — Kurtis R Bahr
(74) *Attorney, Agent, or Firm* — IP & T Group LLP

(57) ABSTRACT

The output driving circuit include a pull-down driver, an input/output (IO) control logic, a gate control logic, and an inverter. The pull-down driver includes first, second, and third transistors that are sequentially coupled between a pad and a ground node. The IO control logic is configured to receive a clock signal and an enable signal, and transfer a first control signal to the third transistor. The gate control logic is configured to receive a voltage of the pad and output a feedback voltage to a gate electrode of the first transistor. The inverter is configured to invert the enable signal and transfer an inverted enable signal to the gate control logic. Therefore, the reliability of the output driving circuit can be improved.

16 Claims, 15 Drawing Sheets

(56) References Cited

U.S. PATENT DOCUMENTS

| | | | | |
|---|---|---|---|---|
| 9,419,615 B2* | 8/2016 | Hsu | ................ | H03K 19/017509 |
| 2010/0141324 A1* | 6/2010 | Wang | ............. | H03K 19/018521 |
| | | | | 327/333 |
| 2010/0176848 A1* | 7/2010 | Du | ........................ | G11C 7/1051 |
| | | | | 327/108 |
| 2010/0271118 A1* | 10/2010 | Bhattacharya | ..... | H03K 17/0822 |
| | | | | 327/543 |

* cited by examiner

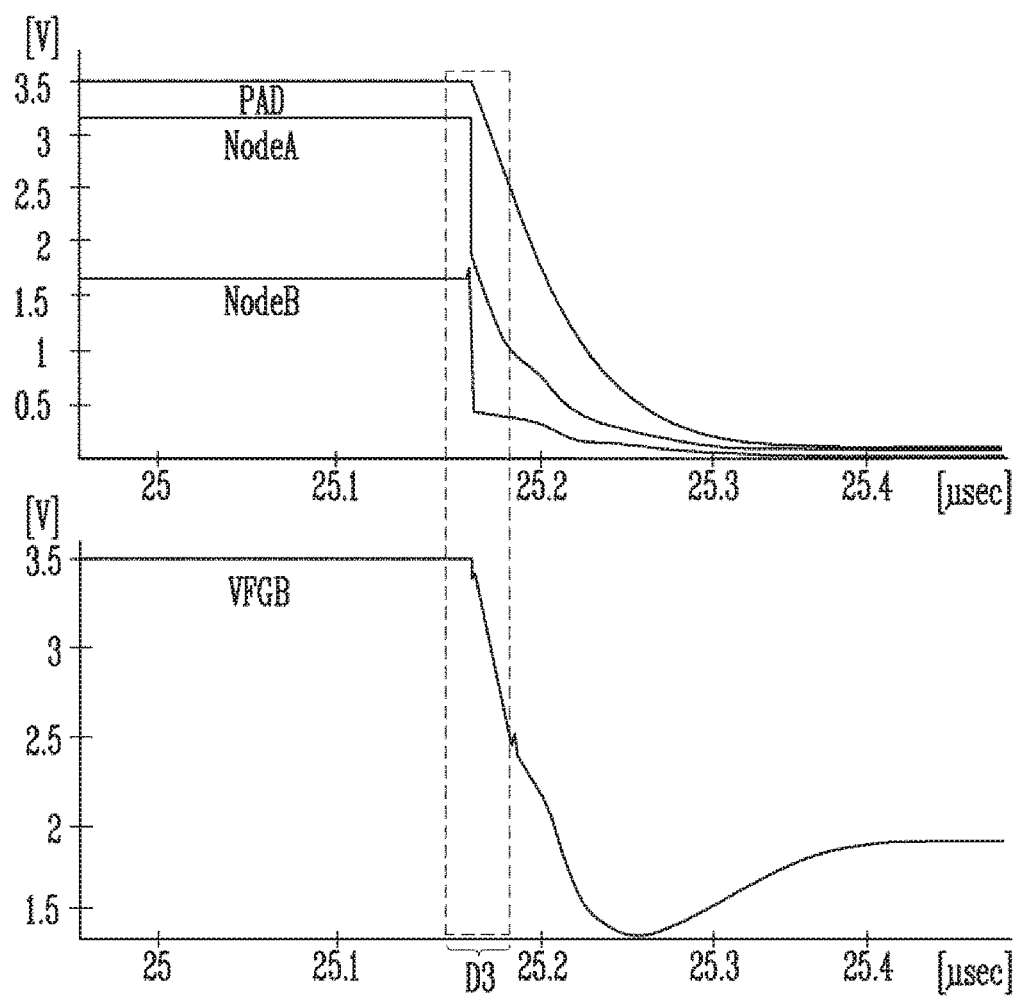

OUTPUT DRIVING CIRCUIT

CROSS-REFERENCE TO RELATED APPLICATION

This application is a continuation of U.S. patent application Ser. No. 15/858,516 filed on Dec. 29, 2017, which claims priority to Korean patent application number 10-2017-0063919, filed on May 24, 2017. The disclosure of each of the foregoing applications is herein incorporated by reference in its entirety.

BACKGROUND

Field of Invention

Various embodiments of the present disclosure generally relate to an electronic device, and more particularly, to an output driving circuit for a semiconductor device, a semiconductor device including the output driving circuit and various electronic devices including the same.

Description of Related Art

In recent chips, a high-speed interface integrated processor (IP) requiring a low-supply voltage and a high-speed operation is widely used. Accordingly, CMOSFETs having a medium gate oxide for 1.8 V operation or CMOSFETs having a thin gate oxide for 0.9 V operation, rather than CMOSFETs having a thick gate oxide for 3.3 V operation, are widely used.

However, an IO circuit manufactured using CMOSFETs having a medium gate oxide for 1.8 V operation or a thin gate oxide for 0.9 V operation may not work properly when a voltage of 3.3 V is applied. Hence, an input/output (IO) circuit for a semiconductor device may still need to support application circuits that require a 3.3 V interface voltage.

SUMMARY

Various embodiments of the present disclosure are directed to an output driving circuit for a semiconductor device that exhibits enhanced reliability and can operate effectively across a greater range of voltages.

A first aspect of the present disclosure is directed to an improved output driving circuit for a semiconductor device. The output driving circuit may include a pull-down driver, an input/output (IO) control logic, a gate control logic, and an inverter. The pull-down driver may include first, second, and third transistors. The transistors may be sequentially coupled in series between a pad and a ground node. The IO control logic may be configured to receive a clock signal and an enable signal, and transfer a first control signal to the third transistor. The gate control logic may be configured to receive a voltage of the pad and output a feedback voltage to a gate electrode of the first transistor. The inverter may be configured to invert the enable signal and transfer an inverted enable signal to the gate control logic. The output driving circuit exhibits improved reliability.

In an embodiment, the output driving circuit may further include an internal resistor coupled between the pad and the gate control logic.

In an embodiment, the voltage of the pad may be a high voltage having a value of 1.5V and greater.

In an embodiment, the voltage of the pad may be high voltage having a value of about 1.8 V and greater.

In an embodiment, the voltage of the pad may be a high voltage having a value of from about 1.8 V to about 3.3 V.

In an embodiment, the first, second, and third transistors included in the pull-down driver may be NMOS transistors.

In an embodiment, a first supply voltage may be applied to a gate electrode of the second transistor.

In an embodiment, the gate control logic may include first, second, and third PMOS transistors that are sequentially coupled in series between the voltage of the pad and the first supply voltage, the first supply voltage may be applied to a gate electrode of the first PMOS transistor, the voltage of the pad may be applied to a gate electrode of the second PMOS transistor, the inverted enable signal may be applied to a gate electrode of the third PMOS transistor, and a voltage of bulk regions of the first, second, and third PMOS transistors may be outputted as the feedback voltage.

In an embodiment, the first PMOS transistor may have a source electrode electrically coupled to the bulk region of the first PMOS transistor.

In an embodiment, the gate control logic may further include a fourth PMOS transistor coupled between the first supply voltage and the bulk region, and the voltage of the pad may be applied to a gate electrode of the fourth PMOS transistor.

In an embodiment, the fourth PMOS transistor may have a source electrode electrically coupled to a bulk region of the fourth PMOS transistor.

In an embodiment, the gate control logic may further include a fourth NMOS transistor and a fifth PMOS transistor that are sequentially coupled in series between the bulk region and the first supply voltage, the first supply voltage may be applied to a gate electrode of the fourth NMOS transistor, and a second control signal may be applied to a gate electrode of the fifth PMOS transistor.

A second aspect of the present disclosure is directed to an improved semiconductor device having an output driving circuit. The output driving circuit may include a pull-down driver, an input/output (IO) control logic, a gate control logic, and an inverter. The pull-down driver may include first, second, and third transistors. The transistors may be sequentially coupled in series between a pad and a ground node. The IO control logic may be configured to receive a clock signal and an enable signal, and transfer a first control signal to the third transistor. The gate control logic may be configured to receive a voltage of the pad and output a feedback voltage to a gate electrode of the first transistor. The inverter may be configured to invert the enable signal and transfer an inverted enable signal to the gate control logic. The semiconductor device exhibits improved reliability.

In an embodiment, the output driving circuit may further include an internal resistor coupled between the pad and the gate control logic.

In an embodiment, the voltage of the pad may be a high voltage having a value of 1.5V and greater.

In an embodiment, the first, second, and third transistors included in the pull-down driver may be NMOS transistors.

In an embodiment, a first supply voltage may be applied to a gate electrode of the second transistor.

In an embodiment, the gate control logic may include first, second, and third PMOS transistors that are sequentially coupled in series between the voltage of the pad and the first supply voltage, the first supply voltage may be applied to a gate electrode of the first PMOS transistor, the voltage of the pad may be applied to a gate electrode of the second PMOS transistor, the inverted enable signal may be applied to a gate electrode of the third PMOS transistor, and a voltage of bulk regions of the first, second, and third PMOS transistors may be outputted as the feedback voltage.

These and other features and advantages of the present invention will become apparent to those skilled in the art to which the present invention pertains from the following detailed description with reference to the accompanying drawings.

BRIEF DESCRIPTION OF THE DRAWINGS

FIG. 12B is an enlarged waveform diagram illustrating a T3 period shown in FIG. 12A.

DETAILED DESCRIPTION

Figure 1:
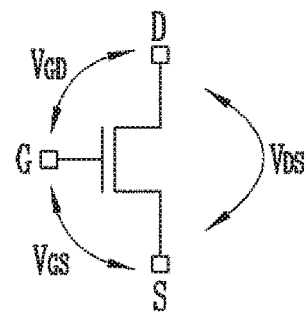
FIG. 1 is a diagram explaining an operating condition of a medium gate oxide device.

Embodiments of the present disclosure are described with reference to the accompanying drawings in order to describe the present disclosure in detail so that those having ordinary knowledge in the technical field to which the present disclosure pertains can easily practice the present disclosure. It should be noted that the same reference numerals are used to designate the same or similar elements throughout the drawings. In the following description of the present disclosure, detailed descriptions of known functions and configurations which are deemed to make the gist of the present disclosure obscure will be omitted.

FIG. 1 is a diagram explaining the operating condition of a medium gate oxide device.

In order for a medium gate oxide device 100 to stably operate, a gate-source voltage $V_{GS}$, a gate-drain voltage $V_{GD}$, and a drain-source voltage $V_{DS}$ of the medium gate oxide device 100 should satisfy certain reliability conditions. For example, if the medium gate oxide device 100 is a device designed for 1.8 V operation, when the gate-source voltage $V_{GS}$, the gate-drain voltage $V_{GD}$, and the drain-source voltage $V_{DS}$ are less than 110% of 1.8 V, the reliability of the device is guaranteed. The reliability conditions for such a device are summarized below in the following Table 1.

TABLE 1

| Voltage difference | Reliability condition |
| --- | --- |
| $V_{GD}$ | $V_{GD} \leq 1.98$ V |
| $V_{GS}$ | $V_{GS} \leq 1.98$ V |
| $V_{DS}$ | $V_{DS} \leq 1.98$ V |

Figure 2:
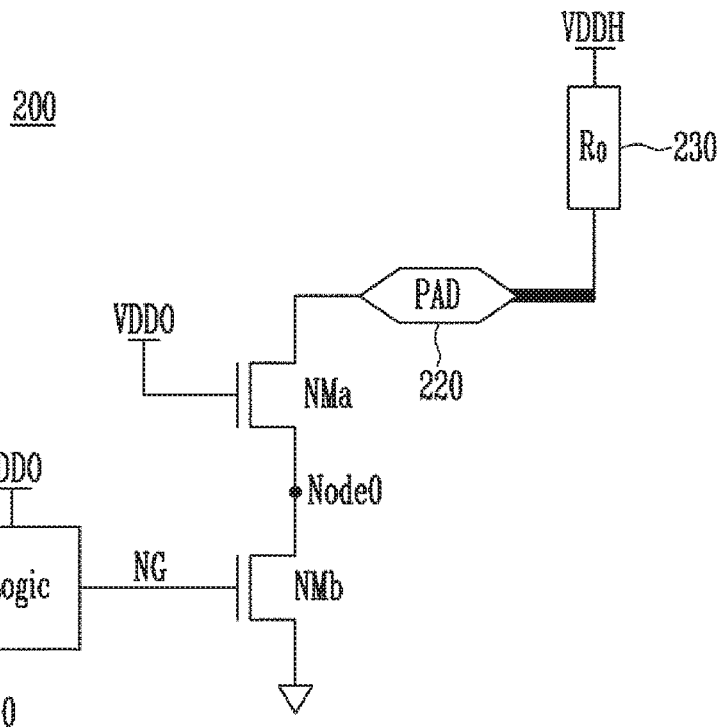
FIG. 2 is a circuit diagram illustrating an example of a conventional output driving circuit.
Figure 3:
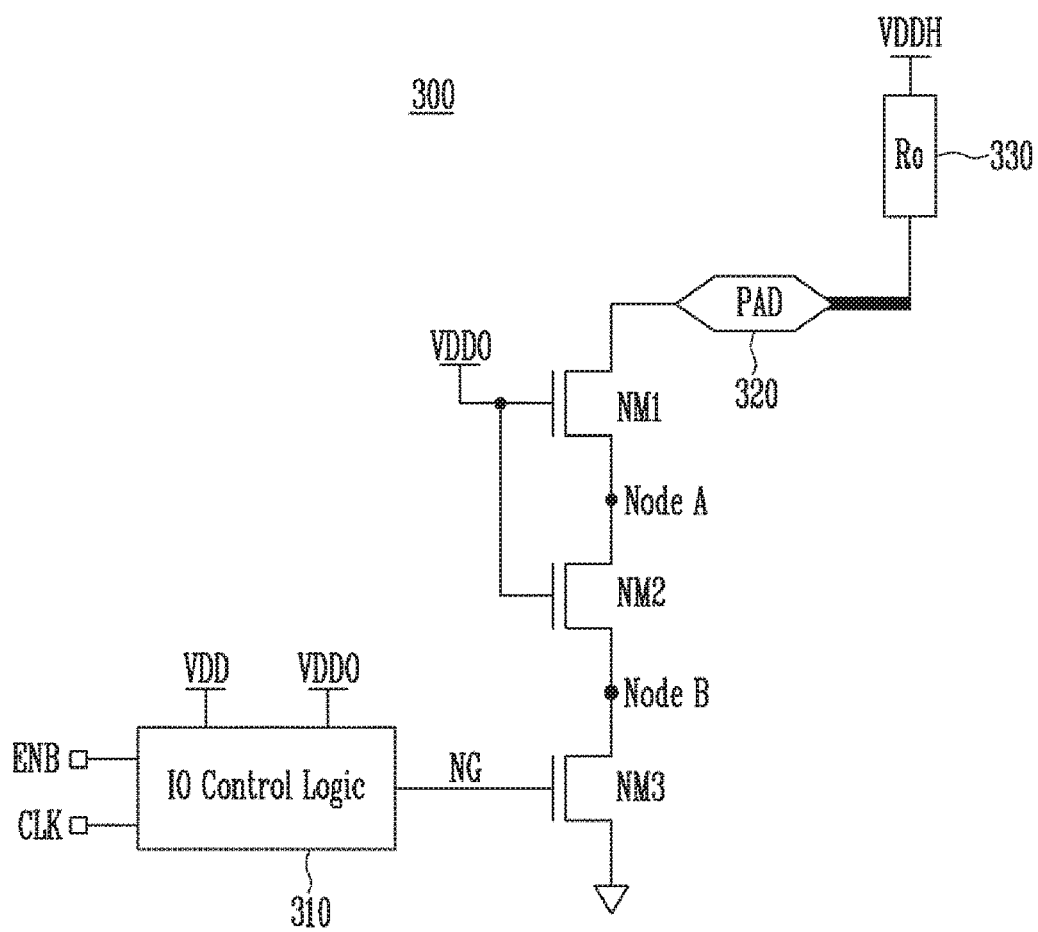
FIG. 3 is a circuit diagram illustrating another example of a conventional output driving circuit.

In order to satisfy these conditions, a conventional output driving circuit illustrated in FIG. 2 or 3 may be employed.

FIG. 2 is a circuit diagram illustrating an exemplary conventional output driving circuit.

Referring to FIG. 2, an output driving circuit 200 may include an input/output (IO) control logic 210, and a first transistor NMa and a second transistor NMb that are coupled in series to each other. The first transistor NMa is coupled between a pad 220 and a node Node0, and the second transistor NMb is coupled between the node Node0 and ground. A first supply voltage VDDO is applied to the gate electrode of the first transistor NMa, and a gate control signal NG outputted from the IO control logic 210 is applied to the gate electrode of the second transistor NMb. Further, the IO control logic 210 is operated based on the first supply voltage VDDO and a second supply voltage VDD, and is configured to receive an enable signal ENB and a clock signal CLK and output the gate control signal NG. The pad 220 is coupled to an external high voltage VDDH through an external resistor $R_0$ 230.

Figure 4A:
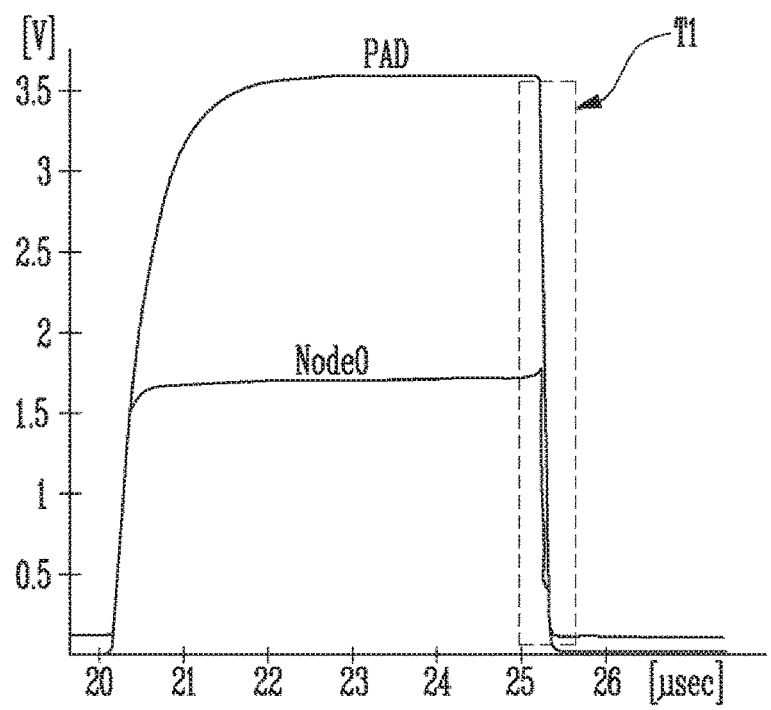
FIG. 4A is an operation waveform diagram of the output driving circuit shown in FIG. 2.
Figure 4B:
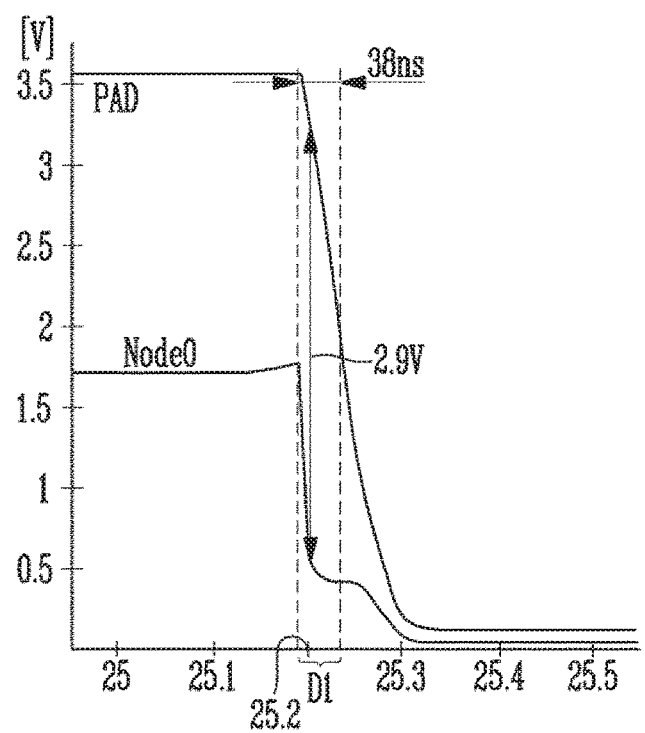
FIG. 4B is an enlarged waveform diagram illustrating a T1 period shown in FIG. 4A.

The operation waveform diagram of the output driving circuit 200 illustrated in FIG. 2 is illustrated in FIGS. 4A and 4B. The operation of the output driving circuit 200 illustrated in FIG. 2 will be described in detail later with reference to FIGS. 4A and 4B.

FIG. 3 is a circuit diagram illustrating another exemplary conventional output driving circuit.

Referring to FIG. 3, an output driving circuit 300 includes an input/output (IO) control logic 310, and a first transistor NM1, a second transistor NM2, and a third transistor NM3 that are coupled in series to each other. The first transistor NM1 is coupled between a pad 320 and a node A, the second transistor NM2 is coupled between the node A and a node B, and the third transistor NM3 is coupled between the node B and ground. A first supply voltage VDDO is applied to the gate electrodes of the first transistor NM1 and the second transistor NM2, and a gate control signal NG outputted from the IO control logic 310 is applied to the gate electrode of the third transistor NM3. On the other hand, the IO control logic 310 is operated based on the first supply voltage VDDO and a second supply voltage VDD, and is configured to receive an enable signal ENB and a clock signal CLK and then output the gate control signal NG. The pad 320 is coupled to an external high voltage VDDH through an external resistor $R_0$ 330.

Figure 5A:
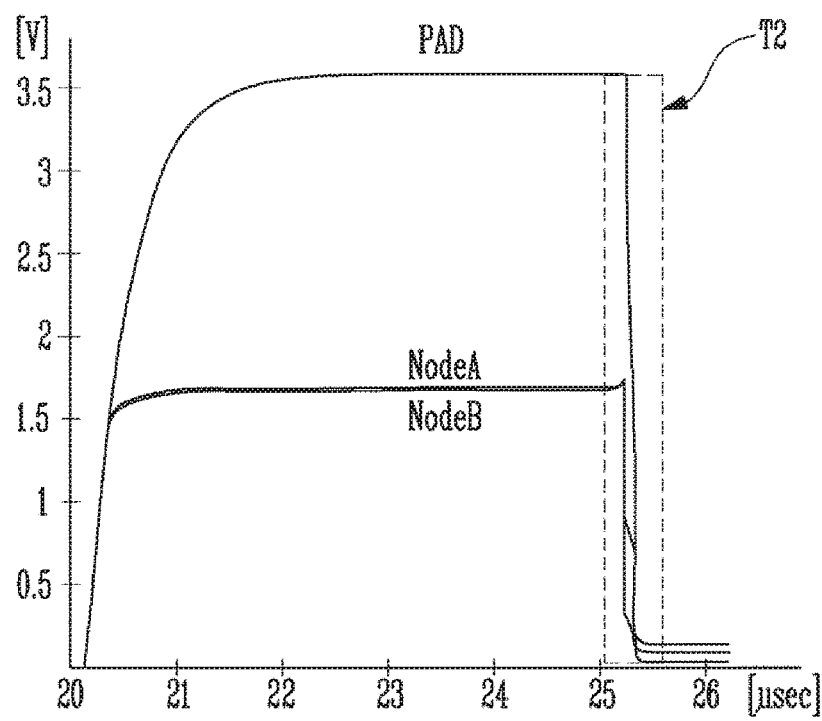
FIG. 5A is an operation waveform diagram of the output driving circuit shown in FIG. 3.
Figure 5B:
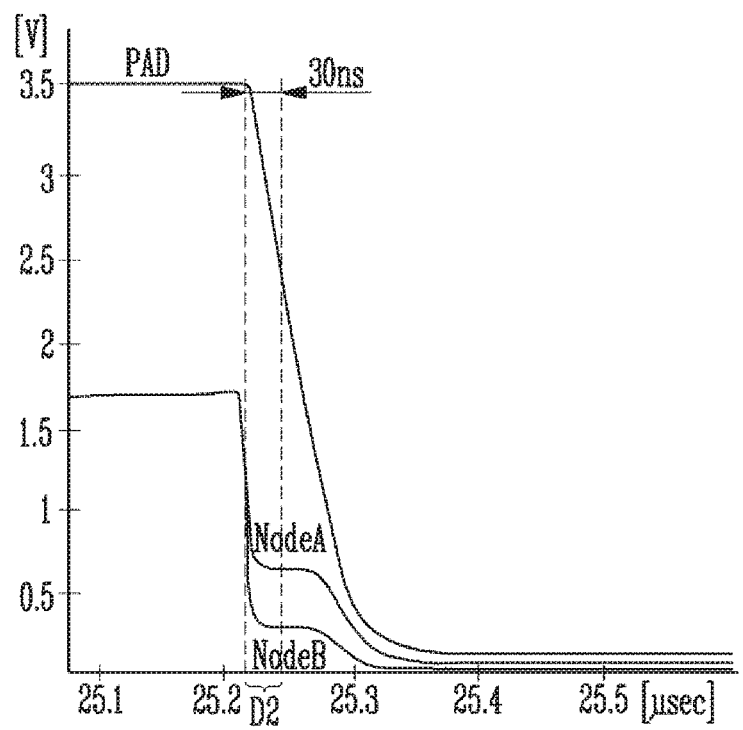
FIG. 5B is an enlarged waveform diagram illustrating a T2 period shown in FIG. 5A.

The operation waveform diagram of the output driving circuit 300 is illustrated in FIGS. 5A and 5B. The operation of the output driving circuit 300 illustrated in FIG. 3 will be described in detail later with reference to FIGS. 5A and 5B.

The conventional output driving circuits 200 and 300 illustrated in FIGS. 2 and 3 have guaranteed the reliability of devices even if a gate-source voltage $V_{GS}$, a gate-drain voltage $V_{GD}$, and a drain-source voltage $V_{DS}$ are present in a period in which reliability is deteriorated to some degree because the thickness of an oxide layer is large when interfacing signals having a voltage of 3.3 V or 5 V using a thick gate oxide device (2.5 V or 3.3 V device). However, when 3.3 V interfacing is driven using a medium gate oxide device (1.8 V device) in a current 32 or less nanometer (nm) process, it becomes difficult to satisfy reliability conditions due to the decreased thickness of the oxide layer of the device.

FIG. 4A is an operation waveform diagram of the output driving circuit of FIG. 2. FIG. 4B is an enlarged waveform diagram illustrating a T1 period of FIG. 4A.

Referring to FIG. 4A, the voltage PAD of the pad 220 and the voltage Node0 of the node Node0 depending on the pad voltage PAD are illustrated. On the whole, a difference between the voltage PAD of the pad 220 and the voltage Node0 of the node Node0 is maintained at about 2 V or less. Therefore, the condition of the drain-source voltage $V_{DS}$ of the first transistor NMa is satisfied. However, as the voltage PAD of the pad 220 drops rapidly, the voltage Node0 of the node Node0 also drops. In this case, there may occur a situation in which the reliability condition of the drain-source voltage $V_{DS}$ is not satisfied.

Referring to FIG. 4B, a waveform diagram of a T1 period indicated by a dotted line in FIG. 4A is enlarged and illustrated. As illustrated in FIG. 4B, during a D1 period (about 38 ns) of the T1 period, in which the voltage PAD of the pad 220 and the voltage Node0 of the node Node0 drop, the difference between the voltages PAD of the pad 220 and the node Node0 may temporarily be 2.9 V, which indicates a situation in which the reliability condition of the drain-source voltage $V_{DS}$ of a 1.8 V device is not satisfied.

FIG. 5A is an enlarged waveform diagram of the output driving circuit of FIG. 3. FIG. 5B is an enlarged waveform diagram of a T2 period of FIG. 5A.

Referring to FIG. 5A, the voltage PAD of a pad 320 and the voltages NodeA and NodeB of a node A and a node B depending on the pad voltage PAD are illustrated. On the whole, a difference between the voltages PAD and NodeA of the pad 320 and the node A or a difference between the voltages PAD and NodeB of the pad 320 and the node B is maintained at about 2 V or less. Therefore, the drain-source voltage $V_{DS}$ conditions of the first transistor NM1 and the second transistor NM2 are satisfied. However, as the voltage PAD of the pad 320 drops rapidly, there may occur a situation in which the reliability conditions of the drain-source voltage VDC of the first transistor NM1 and the second transistor NM2 are not satisfied.

Referring to FIG. 5B, a waveform diagram of the T2 period indicated by a dotted line in FIG. 5A is enlarged and illustrated. As illustrated in FIG. 5B, during a D2 period (about 30 ns) of the T2 period, in which the voltage PAD of the pad 320 and the voltage NodeA of the node A drop, a difference between the voltage PAD of the pad 320 and the voltage NodeA of the node A may temporarily be 2.8 V, which indicates that the reliability condition of the drain-source voltage $V_{DS}$ of the 1.8V device is not satisfied.

Therefore, a new output driving circuit having improved reliability is required.

Figure 6:
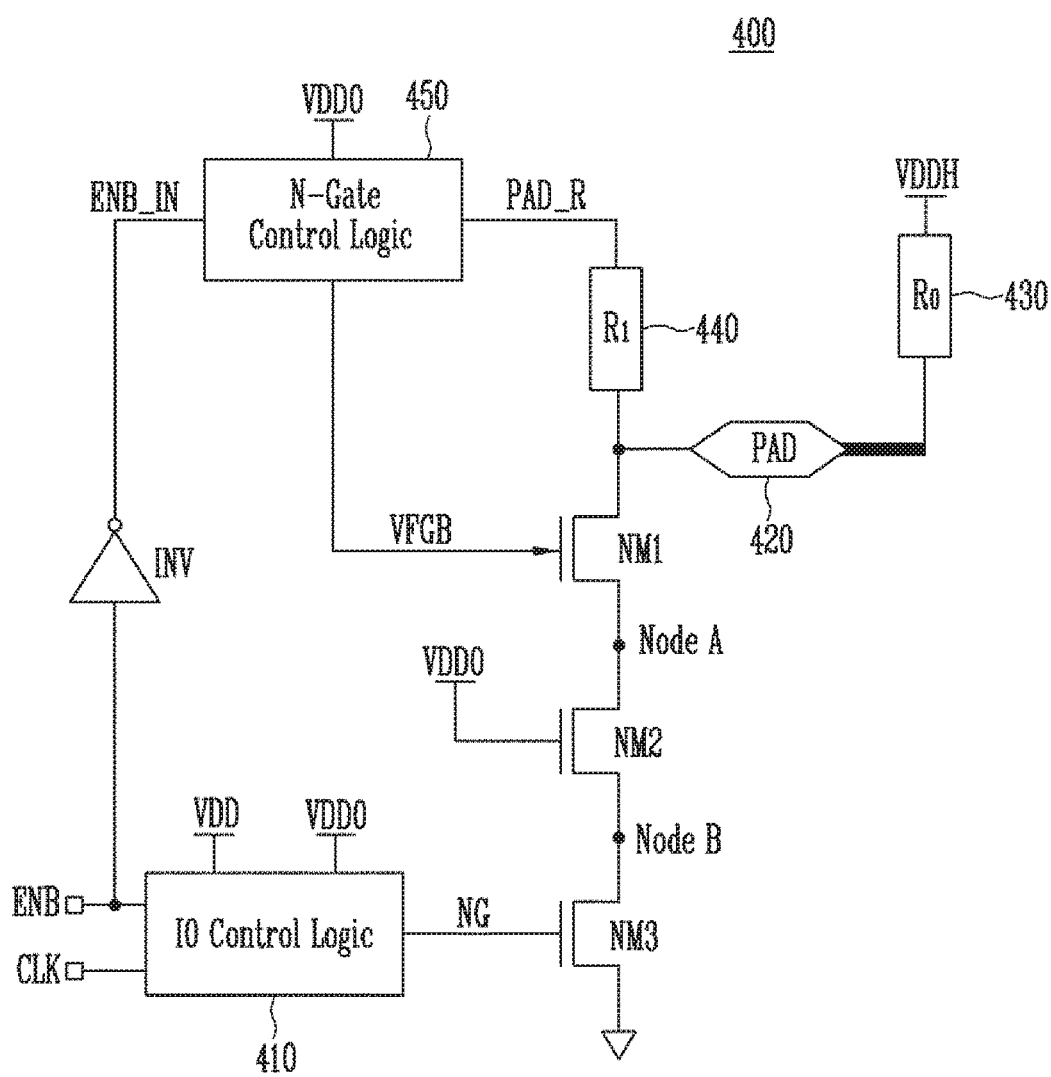
FIG. 6 is a circuit diagram illustrating an output driving circuit according to an embodiment of the present disclosure.

FIG. 6 is a circuit diagram illustrating an output driving circuit according to an embodiment of the present disclosure.

Referring to FIG. 6, an output driving circuit 400 according to an embodiment of the present disclosure may include first, second, and third transistors NM1, NM2, and NM3, which are sequentially coupled in series between a pad 420 and a ground node, an input/output (IO) control logic 410, a gate control logic 450, and an inverter INV. The IO control logic 410 may receive a clock signal CLK and an enable signal ENB, and may transfer a first control signal NG to the third transistor NM3. The gate control logic 450 receives a voltage PAD_R of an internal resistor $R_1$ 440. Further, the gate control logic 450 outputs a feedback voltage VFGB to the gate electrode of the first transistor NM1. The inverter INV inverts the enable signal ENB, and transfers an inverted enable signal ENB_IN to the gate control logic 450. The pad 420 is coupled to an external high voltage VDDH through an external resistor $R_0$ 430. The output driving circuit 400 may further include the internal resistor $R_1$ 440 coupled between the pad 420 and the gate control logic 450. In an example embodiment, the internal resistor $R_1$ 440 is may be used as an Electrostatic Discharge (ESD) protection resistor.

The first, second, and third transistors NM1, NM2, and NM3 of the output driving circuit 400 may be medium gate oxide devices of a device operating at 1.8 V. For the improvement of reliability, the transistors NM1, NM2, and NM3 are implemented in a three-stage cascode structure, as illustrated in the drawing. Further, the first, second, and third transistors NM1, NM2, and NM3 of the output driving circuit 400 each have an open-drain output structure, wherein the gate electrode of the first transistor NM1 receives the feedback voltage VFGB, and the voltage level of the feedback voltage VFGB is changed depending on the level of the open-drain output. Here, the first supply voltage VDDO may be 1.8 V, and the external high voltage VDDH may be 3.3 V. When the output is activated, the enable signal ENB is in a high state. If the clock signal CLK is in a high state, the pad 420 makes a transition to a high state in response to the external high voltage VDDH coupled through the external resistor $R_0$ 430. If the clock signal CLK is in a low state, an NMOS driver of the open-drain output structure is turned on and is operated such that the pad 420 is in a low state. Here, the detailed configuration of the gate control logic 450 will be described in detail below with reference to FIGS. 7 and 8.

Figure 7:
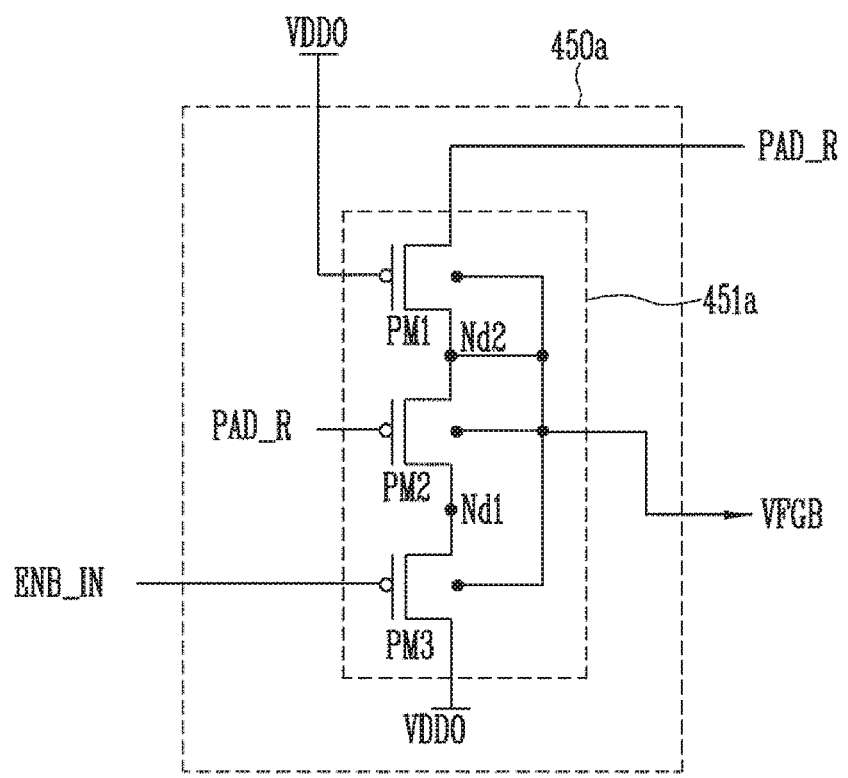
FIG. 7 is a circuit diagram illustrating an embodiment of a gate control logic shown in FIG. 6.

FIG. 7 is a circuit diagram illustrating an embodiment of the gate control logic 450 of FIG. 6.

Referring to FIG. 7, an exemplary gate control logic 450a includes first, second, and third PMOS transistors PM1, PM2, and PM3 that are sequentially coupled in series between the pad voltage PAD_R and the first supply voltage VDDO. The cascade structure of the first, second, and third PMOS transistors PM1, PM2 and PM3 may configure a feedback transistor unit 451a. The drain electrode of the first PMOS transistor PM1 and the source electrode of the second PMOS transistor PM2 are coupled to a node Nd2. Further, the drain electrode of the second PMOS transistor PM2 and the source electrode of the third PMOS transistor PM3 are coupled to a node Nd1. The first supply voltage VDDO is applied to the gate electrode of the first PMOS transistor PM1, the pad voltage PAD_R is applied to the gate electrode of the second PMOS transistor PM2, and the inverted enable signal ENB_IN is applied to the gate electrode of the third PMOS transistor PM3. Further, bulk regions of the first, second, and third PMOS transistors PM1, PM2, and PM3 are coupled to the feedback voltage VFGB.

When the clock signal CLK is in a low state, the pad voltage PAD_R makes a transition to a low state so that the second PMOS transistor PM2 is turned on, and thus the first supply voltage VDDO (i.e., 1.8 V) is outputted as the feedback voltage VFGB. Accordingly, the first transistor NM1 remains turned on. Here, since the gate voltage of the first PMOS transistor PM1 is the first supply voltage VDDO, and the pad 420 is in a low state, the first PMOS transistor PM1 is turned off. Consequently, a current path in a direction from the first supply voltage VDDO coupled to the third PMOS transistor PM3 to the pad voltage PAD_R is blocked.

Thereafter, when the clock signal CLK makes a transition to a high state, at the time at which the voltage of the pad 420 is changed from 0 V to the external high voltage VDDH (i.e., 3.3 V), the first PMOS transistor PM1 is turned on and thus the feedback voltage VFGB follows the voltage level of the pad 420 at a moment when a level of the pad voltage PAD_R is greater than levels of the first supply voltage VDDO and the threshold voltage Vth_PM1 of the first PMOS transistor. Here, the feedback voltage VFGB may be increased from the first supply voltage VDDO to the external high voltage VDDH. Simultaneously with the increase in the feedback voltage VFGB, the second PMOS transistor PM2 becomes turned off as the gate voltage of the second PMOS transistor PM2 (i.e., the pad voltage PAD_R) becomes identical to the feedback voltage VFGB. Accordingly, a current path from the output terminal of the feedback voltage VFGB to the first supply voltage VDDO coupled to the third PMOS transistor PM3 is blocked so that power consumption may be decreased and thus the drop of the feedback voltage VFGB may be prevented. In addition, the voltage of the node Nd1 is 1.8 V. Therefore, even if the feedback voltage VFGB increases to 3.3 V, the voltage difference among the gate-source voltage $V_{GS}$, the gate-drain voltage $V_{GD}$, and the drain-source voltage $V_{DS}$ of the second PMOS transistor PM2 may be maintained at 1.98 V or less and thus the reliability condition of the second PMOS transistor PM2 may be satisfied.

That is, the output driving circuit according to an embodiment of the present disclosure may improve the reliability of the device because the difference between the voltages of the pad 420 and the node A may be maintained at 1.98 V or less even if the clock signal CLK makes a transition from a low state to a high state, that is, even if the voltage of the pad 420 makes a transition from the external high voltage VDDH to 0 V, in the characteristics of the open-drain output structure. The operation waveform diagrams of the output driving circuit 400 according to the embodiments of FIGS. 6 and 7 are illustrated in FIGS. 9A and 9B, and the operating characteristics thereof will be described in detail later with reference to FIGS. 9A and 9B.

Figure 8:
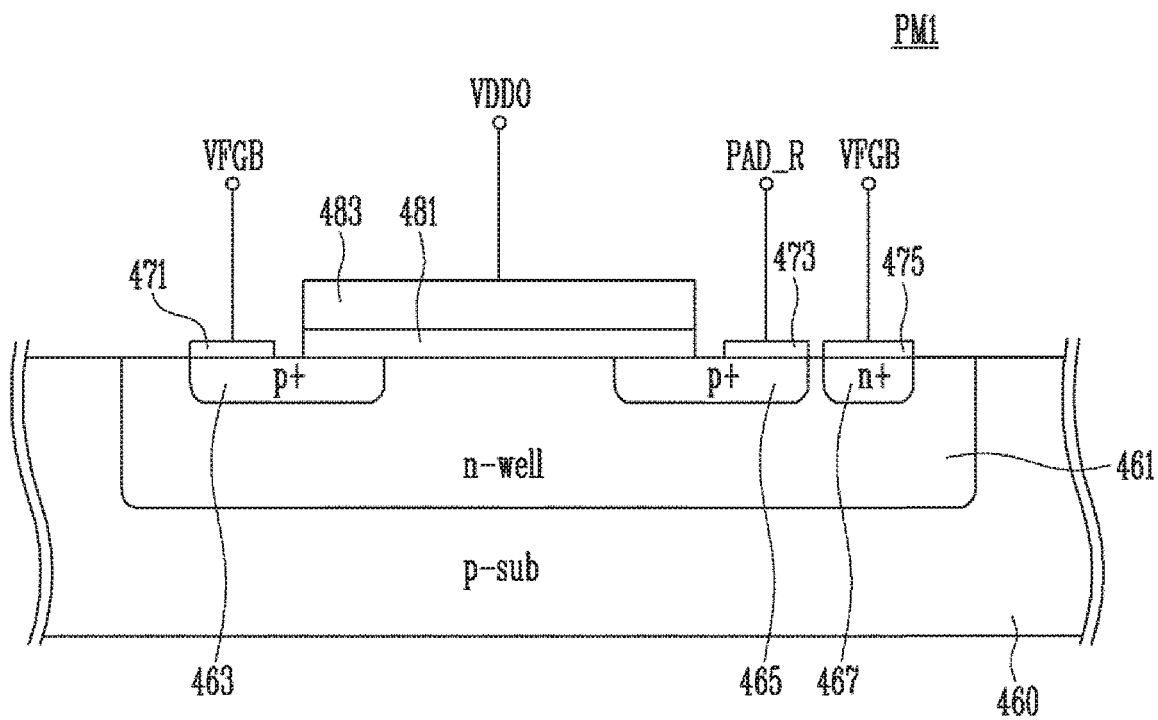
FIG. 8 is a diagram illustrating the detailed configuration of a first PMOS transistor shown in FIG. 7.

FIG. 8 is a diagram illustrating the detailed configuration of the first PMOS transistor PM1 of FIG. 7.

In FIG. 7, the bulk region of the first PMOS transistor PM1 is illustrated as being coupled to the feedback voltage VFGB. In FIG. 8, the structure of the first PMOS transistor PM1 is illustrated in detail.

Referring to FIG. 8, an N-type well (n-well) 461 is formed in a P-type substrate (p-sub) 460. The N-type well 461 may act as the bulk region of the first PMOS transistor PM1. Further, a source region 465 and a drain region 463 are formed in the N-type well 461. The source region 465 and the drain region 463 may be formed as high-concentration P+ regions. A source electrode 473 and a drain electrode 471 are formed on the source region 465 and the drain region 463, respectively. Further, an insulating layer 481 and a gate electrode 483 are formed on the N-type well 461. By means of this configuration, the PMOS transistor is implemented. A high-concentration N+ region 467 is additionally formed in the N-type well 461, and thus electrical coupling to the N-type well 461 that is a bulk region is provided. A bulk electrode 475 is formed on the N+ region 467.

Referring to the electrode coupling of the first PMOS transistor PM1, the source electrode 473 is coupled to the pad voltage PAD_R, the drain electrode 471 is coupled to the feedback voltage VFGB, and the gate electrode 483 is coupled to the first supply voltage VDDO. Further, the bulk electrode 475 is coupled to the feedback voltage VFGB, and thus the electrical coupling relation of the first PMOS transistor PM1 illustrated in FIG. 7 may be established.

Figure 9:
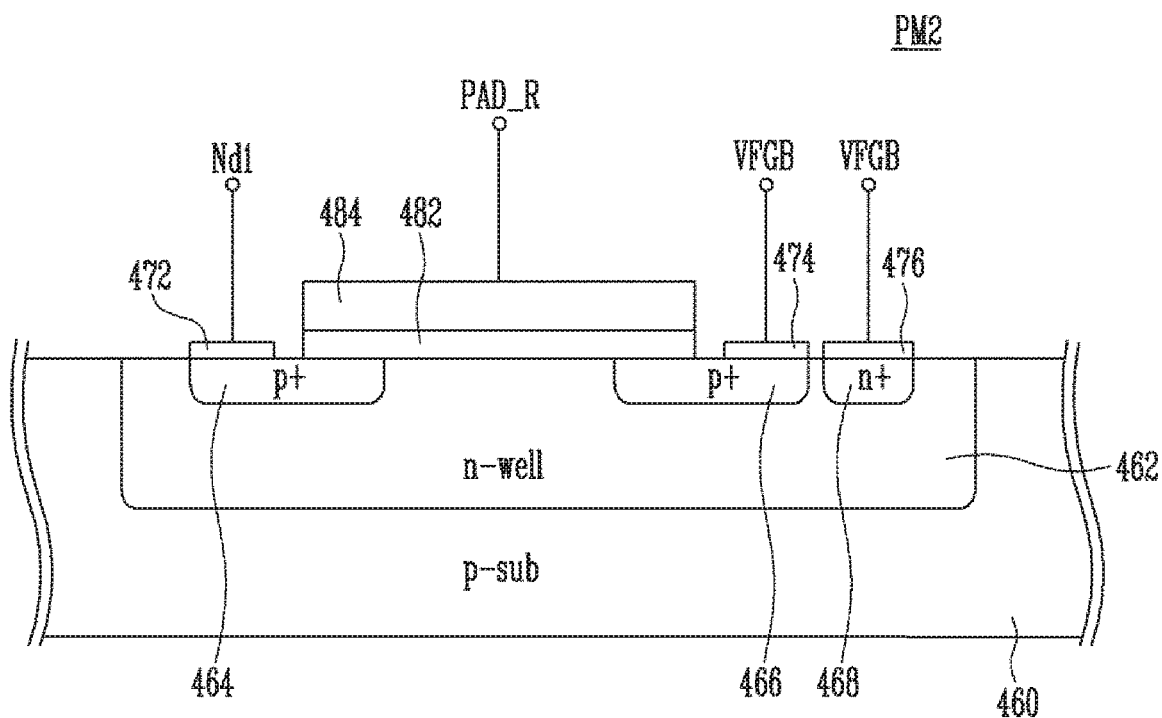
FIG. 9 is a diagram illustrating the detailed configuration of a second PMOS transistor shown in FIG. 7.

FIG. 9 is a diagram illustrating the detailed configuration of the second PMOS transistor PM2 of FIG. 7.

In FIG. 7, the bulk region of the second PMOS transistor PM2 is illustrated as being coupled to the feedback voltage VFGB. In FIG. 9, the structure of the second PMOS transistor PM2 is illustrated in detail.

Referring to FIG. 9, an N-type well (n-well) 462 is formed in a P-type substrate (p-sub) 460. The N-type well 462 may act as the bulk region of the second PMOS transistor PM2. Further, a source region 466 and a drain region 464 are formed in the N-type well 462. The source region 466 and the drain region 464 may be formed as high-concentration P+ regions. A source electrode 474 and a drain electrode 472 are formed on the source region 466 and the drain region 464, respectively. Further, an insulating layer 482 and a gate electrode 484 are formed on the N-type well 462. By means of this configuration, the PMOS transistor is implemented. Further, a high-concentration N+ region 468 is additionally formed in the N-type well 462, and electrical coupling to the N-type well 462 that is the bulk region is provided. A bulk electrode 476 is formed on the N+ region 468.

Referring to the electrode coupling of the second PMOS transistor PM2, the source electrode 474 is coupled to the feedback voltage VFGB, the drain electrode 472 is coupled to the node Nd1, and the gate electrode 484 is coupled to the pad voltage PAD_R. Further, the bulk electrode 476 is coupled to the feedback voltage VFGB, and thus the electrical coupling relation of the second PMOS transistor PM2 illustrated in FIG. 7 may be established.

Figure 10:
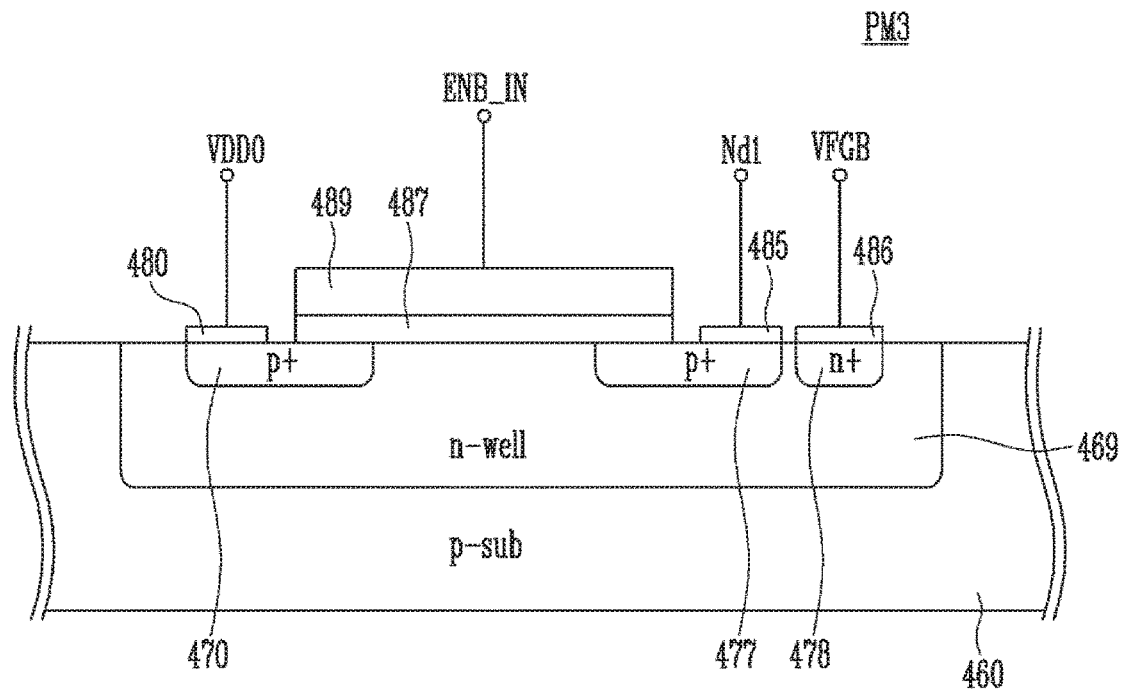
FIG. 10 is a diagram illustrating the detailed configuration of a third PMOS transistor shown in FIG. 7.

FIG. 10 is a diagram illustrating the detailed configuration of the third PMOS transistor PM3 of FIG. 7.

In FIG. 7, the bulk region of the third PMOS transistor PM3 is illustrated as being coupled to the feedback voltage VFGB. In FIG. 10, the structure of the third PMOS transistor PM3 is illustrated in detail.

Referring to FIG. 10, an N-type well (n-well) 469 is formed in a P-type substrate (p-sub) 460. The N-type well 469 may act as the bulk region of the third PMOS transistor PM3. A source region 477 and a drain region 470 are formed in the N-type well 469. The source region 477 and the drain region 470 may be formed as high-concentration P+ regions. A source electrode 485 and a drain electrode 480 may be formed on the source region 477 and the drain region 470, respectively. Further, an insulating layer 487 and a gate electrode 489 are formed on the N-type well 469. By means of this configuration, the PMOS transistor is implemented. Furthermore, a high-concentration N+ region 478 is additionally formed in the N-type well 469, and thus electrical coupling to the N-type well 469 that is the bulk region is provided. A bulk electrode 486 is formed on the N+ region 478.

Referring to the electrode coupling of the third PMOS transistor PM3, the source electrode 485 is coupled to the node Nd1, the drain electrode 480 is coupled to the first supply voltage VDDO, and the gate electrode 489 is coupled to the inverted enable signal ENB_IN. Also, the bulk electrode 486 is coupled to the feedback voltage VFGB, and thus the electrical coupling relation of the third PMOS transistor PM3 illustrated in FIG. 7 may be established.

Figure 11:
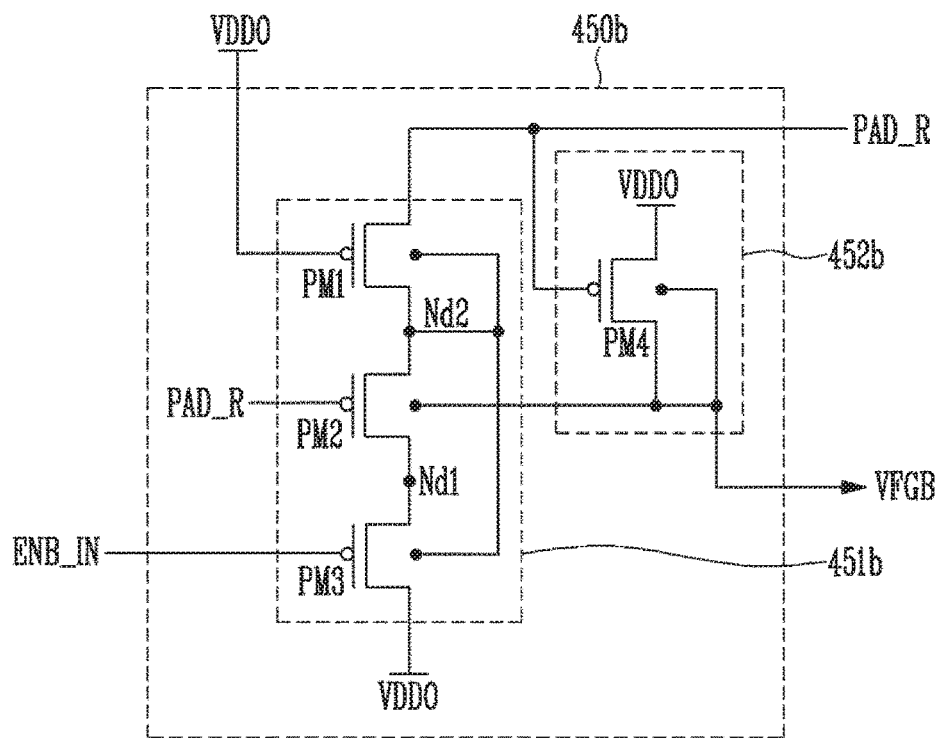
FIG. 11 is a circuit diagram illustrating another embodiment of a gate control logic shown in FIG. 6.

FIG. 11 is a circuit diagram illustrating an embodiment of the gate control logic 450 of FIG. 6.

A gate control logic 450b in FIG. 11 has a structure entirely similar to that of the gate control logic 450a of FIG. 7, and is different from the gate control logic 450a in that a fourth PMOS transistor PM4 is further included. The fourth PMOS transistor PM4 may constitute a voltage stabilization unit 452b. That is, the gate control logic 450b includes a feedback transistor unit 451b and the voltage stabilization unit 452b. An effect obtained by further including the fourth PMOS transistor PM4 will be described later with reference to FIG. 13.

Figure 12A:
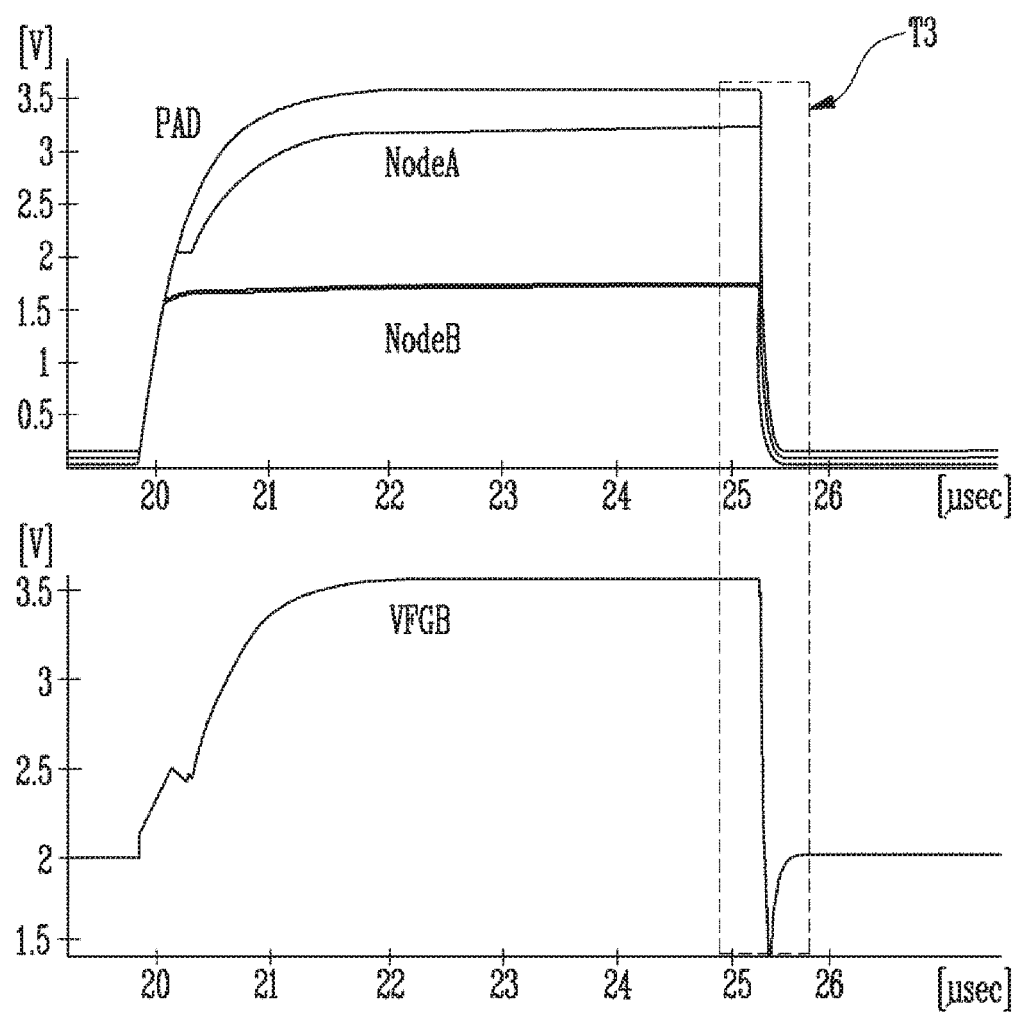
FIG. 12A is an exemplary operation waveform diagram of the output driving circuit shown in FIG. 6.

FIG. 12A is an operation waveform diagram of the output driving circuit 400 of FIG. 6. FIG. 12B is an enlarged waveform diagram illustrating a T3 period of FIG. 12A.

Referring to FIG. 12A, when the clock signal CLK makes a transition from a low state to a high state, the voltage PAD of the pad 420 is changed from the external high voltage VDDH to 0 V. Accordingly, the voltage level of the feedback voltage VFGB is changed from 3.3 V to 1.8 V. That is, after the bias of the pad 420 has been applied to the gate of the first transistor NM1, the gate bias is switched to 1.8 V. Accordingly, a difference between the voltages PAD and NodeA of the pad 420 and the node A may be minimized by gradually dropping the voltage level of the feedback voltage VFGB in a state in which the voltage NodeA of the node A is increased by "VDDH-Vth_NM1". Accordingly, the reliability condition of the first transistor NM1 is satisfied.

Figure 13:
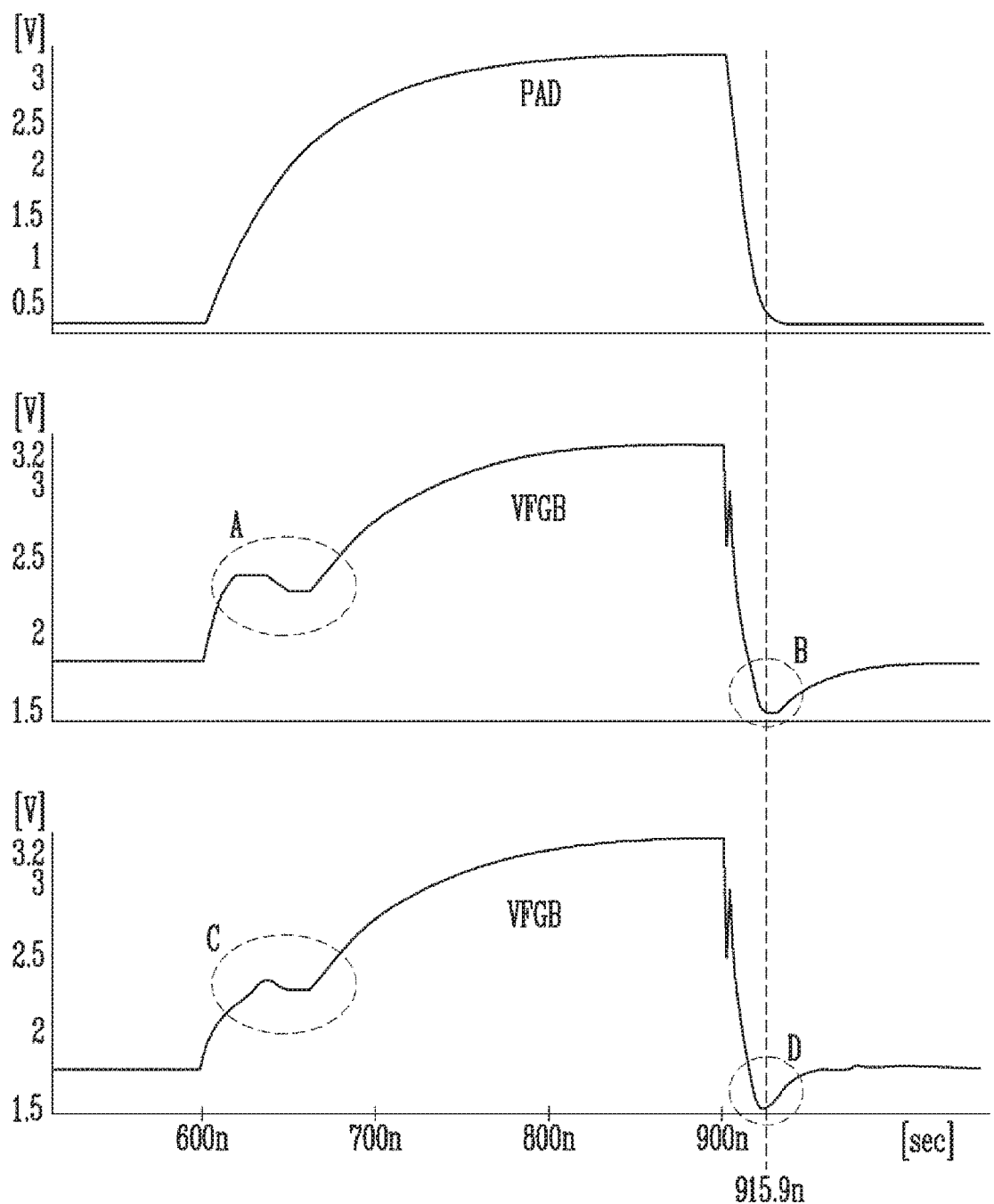
FIG. 13 is an exemplary waveform diagram explaining the effect of adding a fourth PMOS transistor illustrated in FIG. 11.

FIG. 13 is a waveform diagram explaining the effect of adding the fourth PMOS transistor PM4, that is, the voltage stabilization unit 452b illustrated in FIG. 11. In FIG. 13, a pad voltage, a feedback voltage VFGB in the absence of the fourth PMOS transistor PM4, and a feedback voltage VFGB in the presence of the fourth PMOS transistor PM4 are sequentially illustrated.

When the fourth PMOS transistor PM4 is not added, the feedback voltage VFGB is unstable in region A and region B. However, when the fourth PMOS transistor PM4 is added, it can be seen that the feedback voltage VFGB is stable in region C and region D.

Figure 14:
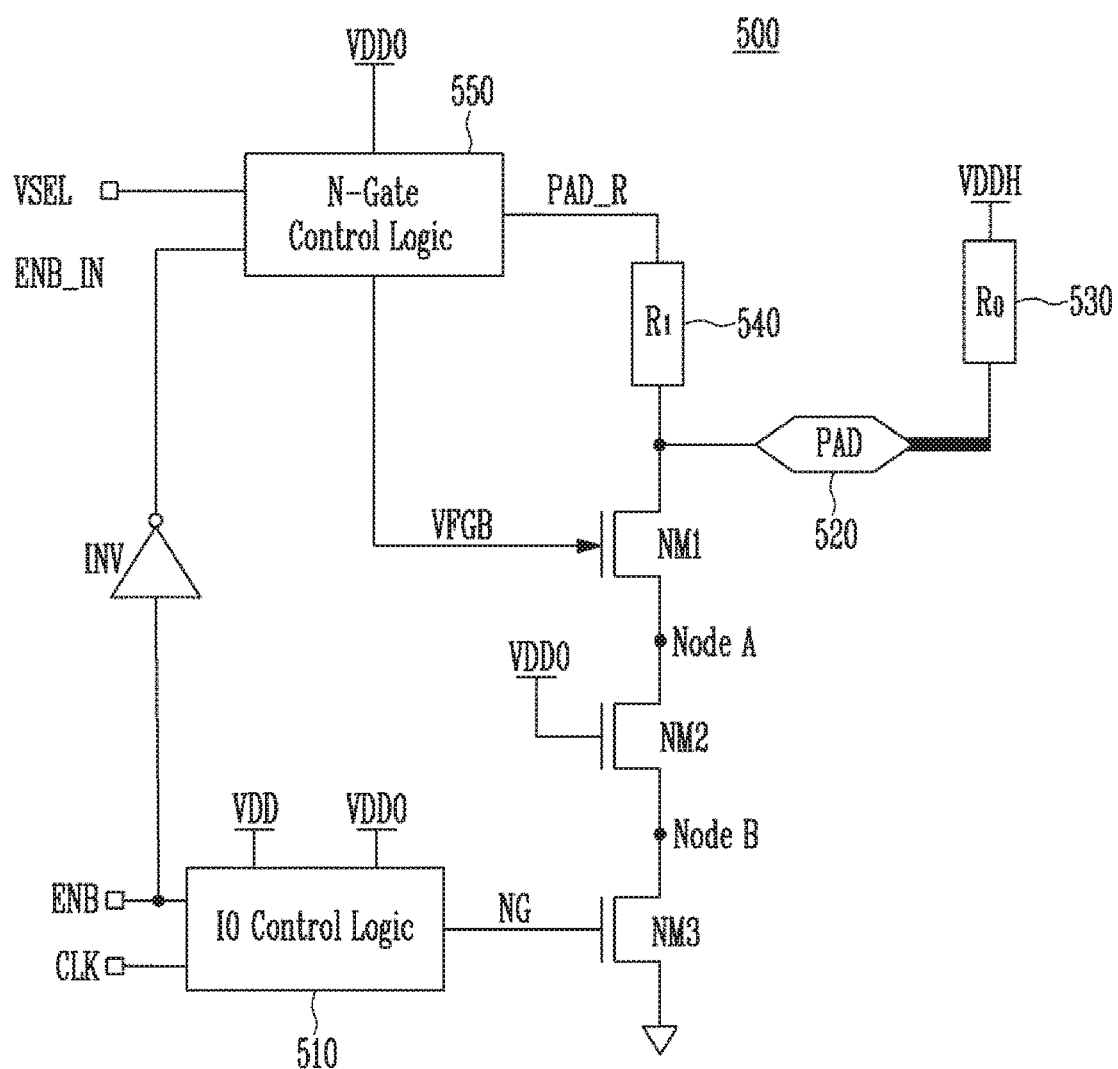
FIG. 14 is a circuit diagram illustrating an output driving circuit according to another embodiment of the present disclosure.

FIG. 14 is a circuit diagram illustrating an output driving circuit according to an embodiment of the present disclosure.

Referring to FIG. 14, an output driving circuit 500 according to an embodiment of the present disclosure may include first, second, and third transistors NM1, NM2, and NM3, which are sequentially coupled in series between a pad 520 and a ground node, an IO control logic 510, a gate control logic 550, and an inverter INV. The IO control logic 510 may receive a clock signal CLK and an enable signal ENB and may transfer a first control signal NG to the third transistor NM3. The gate control logic 550 receives a voltage PAD_R of an internal resistor $R_1$ 540. Further, the gate control logic 550 outputs a feedback voltage VFGB to the gate electrode of the first transistor NM1. The inverter INV inverts the enable signal ENB and transfers an inverted enable signal ENB_IN to the gate control logic 550. Further, the gate control logic 550 receives a second control signal VSEL. The pad 520 is coupled to an external high voltage VDDH through an external resistor $R_0$ 530. The output driving circuit 500 may further include the internal resistor $R_1$ 540 coupled between the pad 520 and the gate control logic 550. As described above, the internal resistor $R_1$ 540 may be used as an ESD protection resistor. The output driving circuit 500 of FIG. 14 is different from the output driving circuit 400 of FIG. 6 in that the gate control logic 550 additionally receives the second control signal VSEL. The detailed configuration and operation of the gate control logic 550 depending on the second control signal will be described below with reference to FIG. 15.

Figure 15:
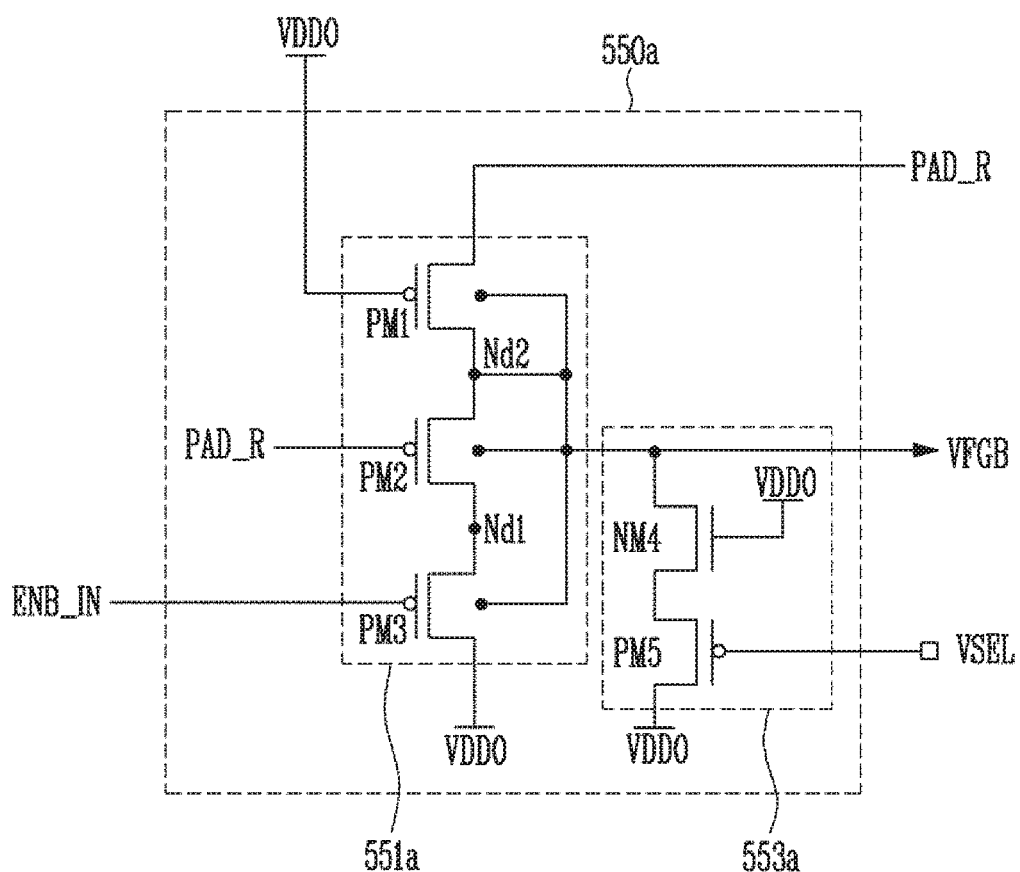
FIG. 15 is a circuit diagram illustrating an embodiment of a gate control logic shown in FIG. 14.

FIG. 15 is a circuit diagram illustrating an embodiment of the gate control logic 500 of FIG. 14.

Referring to FIG. 15, an exemplary gate control logic 550a includes first, second, and third PMOS transistors PM1, PM2, and PM3 that are sequentially coupled in series between the pad voltage PAD_R and the first supply voltage VDDO. The cascade structure of the first, second, and third PMOS transistors PM1, PM2, and PM3 may constitute a feedback transistor unit 551a. First, the drain electrode of the first PMOS transistor PM1 and the source electrode of the second PMOS transistor PM2 are coupled to a node Nd2. Further, the drain electrode of the second PMOS transistor PM2 and the source electrode of the third PMOS transistor PM3 are coupled to a node Nd1. Furthermore, the first supply voltage VDDO is applied to the gate electrode of the first PMOS transistor PM1, the pad voltage PAD_R is applied to the gate electrode of the second PMOS transistor PM2, and the inverted enable signal ENB_IN is applied to the gate electrode of the third PMOS transistor PM3. In addition, the voltage of bulk regions of the first, second, and third PMOS transistors PM1, PM2, and PM3 is outputted as a feedback voltage VFGB.

On the other hand, the gate control logic 550a of FIG. 15 is different from the gate control logic 450a of FIG. 7 in that a fourth NMOS transistor NM4 and a fifth PMOS transistor PM5 that are sequentially coupled in series between the output terminal of the feedback voltage VFGB and the first supply voltage VDDO are further included. The fourth NMOS transistor NM4 and the fifth PMOS transistor PM5 may constitute an external voltage selection unit 553a. The first supply voltage VDDO is applied to the gate electrode of the fourth NMOS transistor NM4, and a second control signal VSEL is applied to the gate electrode of the fifth PMOS transistor PM5. Owing to the additional fourth NMOS transistor NM4, the disclosed open-drain output structure may be operated even when an external high voltage VDDH is 1.8 V. Further, when the external high voltage VDDH is 3.3 V, the reliability condition of the fourth NMOS transistor NM4 may be satisfied by causing the drain voltage of the fourth NMOS transistor NM4 to be "VDDO-Vth_NM4" (about 1.4 V in this case).

When the external high voltage VDDH is 3.3 V, the gate control logic 550a illustrated in FIG. 15 is operated in the same way as the gate control logic 450a illustrated in FIG. 7. When the external voltage VDDH is 1.8 V, the feedback voltage VFGB is maintained at a value between "VDDO-Vth_NM4" and 1.8 V (i.e., 1.4 V≤VFGB≤1.8 V). That is, a more flexible open-drain output structure than the external voltage selection unit 553a may be used.

Figure 16:
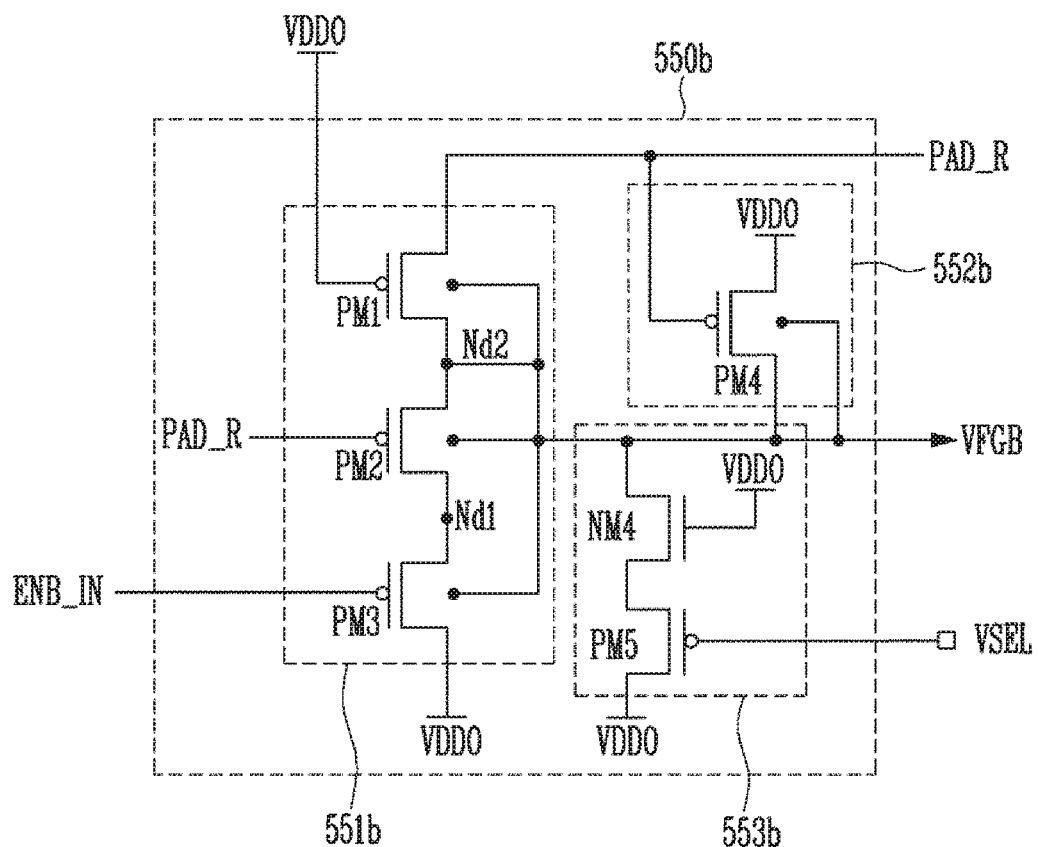
FIG. 16 is a circuit diagram illustrating another embodiment of a gate control logic shown in FIG. 14.

FIG. 16 is a circuit diagram illustrating an embodiment of the gate control logic 550 of FIG. 14.

The configuration of a gate control logic 550b illustrated in FIG. 16 is similar to the gate control logic 550a illustrate in FIG. 15, and includes a feedback transistor unit 551b and an external voltage selection unit 553b. There is a difference in that the gate control logic 550b of FIG. 16 further includes a fourth PMOS transistor PM4 such as that illustrated in FIG. 11, that is, a voltage stabilization unit 552b. As described above with reference to FIG. 13, the fourth PMOS transistor PM4 is added, and thus a more stable feedback voltage VFGB may be formed.

Figure 17:
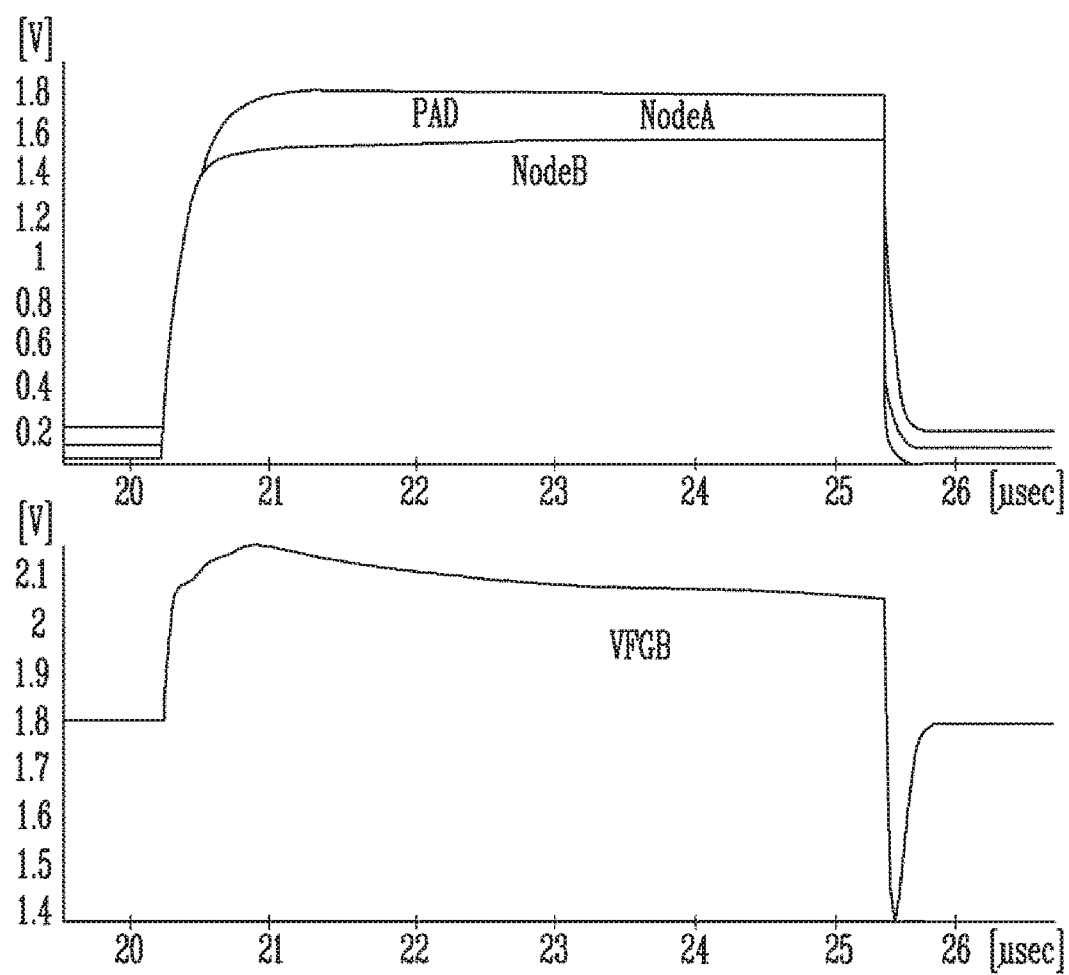
FIG. 17 is a waveform diagram illustrating the operation of the output driving circuit shown in FIG. 14 when an external high voltage is applied.

FIG. 17 is a waveform diagram illustrating the operation of the output driving circuit 500 of FIG. 14 when an external high voltage VDDH is 1.8 V. When the output driving circuit 500 is implemented, as illustrated in FIGS. 14 and 15, the reliability conditions of the corresponding device may be suitably satisfied even when the external high voltage VDDH is 1.8 V.

In accordance with the present technology, an output driving circuit having improved reliability may be provided.

Examples of embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. An output driving circuit, comprising:
a pad coupled to at least two resistors, a voltage of the pad changing based on a clock signal;
a pull-down driver including at least two transistors sequentially coupled in series between the pad and a ground node, a first transistor of the at least two transistors being adjacent to the ground node, and a second transistor of the at least two transistors being adjacent to the pad;
an input/output control logic configured to receive the clock signal and an enable signal, and transfer a control signal to a gate electrode of the first transistor;
a gate control logic configured to receive a voltage of the pad and output a feedback voltage to a gate electrode of the second transistor; and
an inverter configured to invert the enable signal and transfer an inverted enable signal to the gate control logic,
wherein the gate control logic includes at least two transistors including third and fourth transistors coupled in series between a first resistor and a first supply voltage node, the first resistor is one of the at least two resistors, the third transistor of the at least two transistors is adjacent to the pad and receives the first supply voltage, and the fourth transistor of the at least two transistors is adjacent to the first supply voltage node and receives the inverted enable signal.

2. The output driving circuit according to claim 1, further comprising a fifth transistor coupled between the first transistor and the second transistor, wherein the voltage value of a gate electrode of the fifth transistor is greater than the voltage value of a drain electrode of the fifth transistor.

3. The output driving circuit according to claim 1, wherein the logical value of the enable signal received by the input/output control logic is different to the logical value of the inverted enable signal received by the gate control logic.

4. The output driving circuit according to claim 1, wherein the first resistor is an internal resistor coupled between the pad and the gate control logic.

5. The output driving circuit according to claim 1, wherein the voltage of the pad is a voltage having a value of about 1.8 V and greater.

6. The output driving circuit according to claim 1, wherein the voltage of the pad is a voltage having a value of from about 1.8 V to about 3.3 V.

7. The output driving circuit according to claim 1, wherein the at least two transistors included in the pull-down driver are NMOS transistors.

8. The output driving circuit according to claim 1, wherein:
the gate control logic further comprises a sixth transistor coupled between the third transistor and the fourth transistor, and
the voltage of the pad is applied to a gate electrode of the sixth transistor.

9. The output driving circuit according to claim 1, wherein a voltage of bulk regions of the at least two transistors of the gate control logic is outputted as the feedback voltage.

10. The output driving circuit according to claim 1, wherein the at least two transistors of the gate control logic are PMOS transistors.

11. The output driving circuit according to claim 1, wherein the at least two transistors of the pull-down driver have an oxide layer whose thickness is same with thickness of a transistor fabricated by under 32 nm process.

12. The output driving circuit according to claim 1, wherein the at least two transistors of the pull-down driver have an oxide layer whose thickness is thinner than thickness of a transistor fabricated by 32 nm process.

13. The output driving circuit according to claim 1, wherein the at least two transistors of the pull-down driver are medium gate oxide devices operating at 1.8V.

14. The output driving circuit according to claim 1, wherein the at least two transistors of the gate control logic have an oxide layer whose thickness is same with thickness of a transistor fabricated by under 32 nm process.

15. The output driving circuit according to claim 1, wherein the at least two transistors of the gate control logic have an oxide layer whose thickness is thinner than thickness of a transistor fabricated by 32 nm process.

16. The output driving circuit according to claim 1, wherein the at least two transistors of the gate control logic are medium gate oxide devices operating at 1.8V.

* * * * *